SQUELCH CONTROL CIRCUIT
Original Filed Sept. 26, 1966
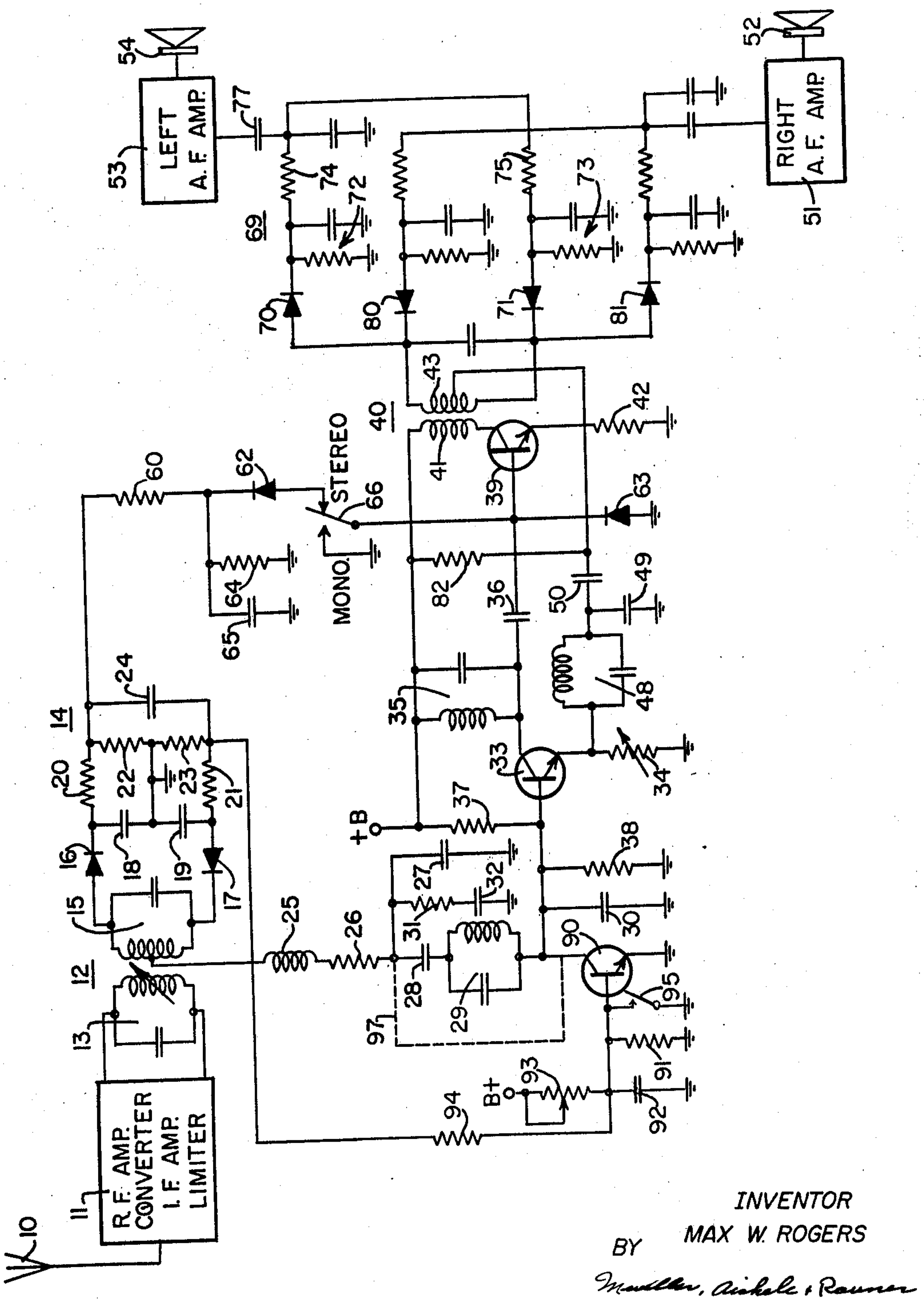
INVENTOR
MAX W. ROGERS
BY
Mueller, Aichele & Rauner
ATTYS.

3,478,272

SQUELCH CONTROL CIRCUIT

Max W. Rogers, Melrose Park, Ill., assignor to Motorola, Inc., Franklin Park, Ill., a corporation of Illinois Continuation of application Ser. No. 581,998, Sept. 26, 1966. This application Dec. 13, 1968, Ser. No. 785,052
Int. Cl. H04b *1/10*
U.S. Cl. 325—478 4 Claims

ABSTRACT OF THE DISCLOSURE

A squelch control circuit in which a transistor conducts during the absence of an FM signal, thus DC and AC shunting the input signals to the circuit being squelched, and provides isolation of the control circuit from the circuit being squelched during reception of radio signals.

This case is a continuation of Ser. No. 581,998 filed Sept. 26, 1966 and now abandoned.

This invention relates to a squelch control system and in particular to an improved noise suppression or squelch control circuit for radio signal receivers and the like.

For the purpose of preventing noise being reproduced in a receiver, it is known to make use of electrically controlled switching devices which, whenever no intelligence signals are received or the receiver is tuned between stations, causes the input of the audio channel to become shorted. In prior systems of this general type, some difficulty has been experienced in providing sufficiently complete squelching action, while at the same time maintaining proper isolation of circuits through the squelch system.

Accordingly, it is an object of this invention to provide a controlled short circuit having an improved isolation between the control circuit and the circuit being squelched.

Another object is to provide a controlled short circuit which DC and AC shunts the inputs of the circuit being squelched when no intelligence signals are received.

A specific form of the squelch control circuit according to the invention is utilized for noise suppression and squelch control in frequency modulated (FM) receivers. It comprises a frequency discriminating circuit having first and second output means. The first output means provides audio frequency signals during the period of reception of FM signals. The second output means provides a negative potential during the period of reception of the FM signals. The first output means is coupled to the input circuit of an audio frequency amplifier. The collector of a transistor is connected to the input circuit means and its emitter is connected to a reference potential. The base of the transistor is connected to a tap of voltage divider means which is connected between the second output means and a positive voltage source. The base is further bypassed through a capacitor to the reference potential. When no FM signal is received a positive potential of the voltage source is applied to the base of the transistor to render the same conductive and to provide a shunt circuit so that no noise signals can be translated to the audio frequency utilization means, whereas when an FM signal is received and the second output means produces a negative potential, the transistor is rendered non-conductive so that the audio frequency signals are translated to the associated amplifier.

The invention is illustrated more particularly in the drawing which is a schematic diagram of a stereophonic FM receiver including the squelch circuit for suppressing noise signals.

In the receiver an FM carrier wave containing the sum signal of the right and left audio signals, the difference of the right and left audio signals amplitude modulated on a suppressed carrier wave, and a pilot signal having a frequency one-half that of the suppressed carrier frequency is received by the antenna 10 and applied to the circuit 11. This circuit 11 represents the usual radio frequency (RF) amplifier, converter, intermediate frequency (IF) amplifier, and limiter which may be of known design. The output of the circuit 11 is coupled to a ratio detector 14 through a bandpass filter comprising two tuned resonant circuits 13 and 15, the inductances of which are the primary and secondary windings of the transformer 12. The composite signal containing the stereo sum signal, the difference stereo signal modulated on the suppressed carrier wave, and the pilot tone are detected in the ratio detector 14.

Although the ratio detector circuit is known, it is described for the sake of completeness. The ratio detector includes diodes 16 and 17 which are connected to both sides of the resonant circuit 15 in opposite polarization. The free end of diode 16 is connected through capacitor 18 and in parallel through resistor 20 in series with resistor 22 to ground. In the same way, the free end of the diode 17 is connected through capacitor 19 and in parallel through resistor 21 in series with resistor 23 to ground. A tertiary winding 25 of transformer 12 is connected to the center of the secondary winding and series connected through resistor 26 and capacitor 27 to ground. This winding is used to couple the primary composite FM stereo signal voltage in parallel with the two diodes. The same composite FM stereo signal is applied through the secondary resonant circuit to the ratio detector to provide equal voltages of opposite polarity for the diodes. A capacitor 24 connected across resistors 22 and 23 provides stabilizing voltage for the ratio detector. The voltage across this capacitor 24 varies in proportion to the signal amplitude as it charges through the two diodes and automatically adjusts itself to an operating DC voltage level. The capacitance of capacitor 24 is relatively high so that it takes an appreciable time for the ratio detector to charge it up after the signal is received.

The audio frequency signal representing the right and left signals and pilot signal are derived from the ratio detector at the junction of resistor 26 and capacitor 27, and are applied through capacitor 28 and a trap and band shaping circuit 29 to the input of the amplifier comprising transistor 33. The trap circuit comprises a parallel resonant circuit 29 followed by a capacitor 30 and a resistor 38. Transistor 33 functions as a 19 kilocycle (kc.) amplifier and at the same time as a low impedance source for the audio signals which are available at the emitter of transistor 33. The variable resistor 34 is connected between the emitter of transistor 33 and ground for gain purposes. The collector of the transistor 33 is connected through a resonant circuit 35 to the B+ potential supply. The voltage divider 37 and 38 provides a potential for operating the base of transistor 33 of the 19 kc. amplifier. The resonant circuit 35 provides further selection of the 19 kc. pilot signal. The pilot signal is coupled through capacitor 36 to the base of transistor 39 of the frequency doubler stage. The collector of transistor 39 is connected through the primary windings 41 of transformer 40 to the B+ potential supply. The secondary winding 43 is tuned to form a 38 kc. demodulating wave which is twice the frequency of the pilot signal and is phase locked thereto. Accordingly, the doubled frequency will appear across the tuned winding when the pilot signal is applied to the base of transistor 39 and the same conducts. A resistor 42 is connected between the emitter of transistor 39 and ground to provide a bias so that the threshold for rendering the transistor circuit conductive is higher than the base-emitter junction threshold voltage.

The composite audio signal which is applied to the base of the 19 kc. amplifier is derived from the emitter of transistor 33 and is applied through a trap circuit 48 and capacitor 50 to the secondary winding 43 of transformer 40 which is part of the stereo detector circuit 69. Accordingly, the sum of the right and left audio frequency signals, as well as the suppressed carrier modulation components of the difference of the right and left signal will be applied from the emitter of transistor 33 to the center tap of the secondary winding of transformer 40. The secondary winding 43 of transformer 40, being center tapped, will also provide a 38 kc. modulating wave having opposite phases at each end thereof. A secondary winding is connected to a stereo detector circuit 69 which will demodulate the difference signal and combine it with the audio frequency sum signal to produce a left and right audio frequency signal.

The stereo detector circuit 69 is known and is described in detail in U.S. Patent No. 3,225,143 but it will be described here in general terms for the sake of completeness. Each stereo detector channel includes a pair of diodes connected in push-pull. The left channel has diodes 70 and 71 which are oppositely polarized and fed with opposite phases of the 38 kc. demodulating wave from transformer 40. The cathode of diode 70 is connected through an RC network 72 to ground and the anode of diode 71 is connected through an RC network 73 to ground. The cathode diode 70 is connected through resistor 74 and resistor 75 to the anode of diode 71. In this manner the 38 kc. demodulating wave is balanced out at the junction of resistors 74 and 75. However, at this point the combination of the envelope of the demodulated difference signal and the audio frequency sum signal appears so that they are combined to produce only the left audio frequency signal which is applied through capacitor 77 to amplifier 53 and reproduced in loudspeaker 54.

As may be seen, the diodes 80 and 81 are connected in a corresponding manner to transformer 40 and to amplifier 51, so that the opposite portion of the demodulating waves will cause conduction thereof and detection of the envelope of this wave will result in the combination of the sum and difference signals causing the production of only the right audio frequency signal which is applied to amplifier 51 and reproduced in loudspeaker 52.

The switch 66 on the base of transistor 39 is connected in stereo position through diode 62 and resistor 60 to the positive plate of capacitor 24. An RC circuit comprising resistor 64 and capacitor 65 is connected between the junction of resistor 60 and the diode 62 and ground. As long as an RF signal is received from a station and detected by ratio detector 14, a positive voltage is applied to diode 62 rendering the same non-conductive. When no RF signals are received, as for example, when the receiver is tuned between stations, the positive voltage at capacitor 24 disappears, so that diode 62 conducts through capacitor 65 to ground for the positive part of unwanted noise signals which appear at the base of transistor 39. Since the base is further connected to the cathode of a diode 63, which is connected between base and ground, the respective negative part of the unwanted noise signals is also bypassed to ground, so that no noise signal can trigger the doubler stage on and off. In the monaural position of switch 66 the base of transistor 39 is connected to ground potential rendering the transistor 39 non-conductive. Thus, no noise signal can be translated through transistor 39.

The ratio detector 14, as already mentioned, provides a DC voltage across capacitor 24. The negative polarity of the DC voltage is applied through resistor 94 to the base of a transistor 90. The collector of the transistor 90 is connected to the base of transistor 33 and is DC biased with a positive voltage which is determined by the ratio of the resistance of resistors 37 and 38. The emitter of transistor 90 is connected to ground. A capacitor 92 in parallel with resistor 91 is connected between the base of transistor 90 and ground potential. Also a mute switch 95 is connected between the base of transistor 90 and ground potential for rendering the squelch control inoperative.

The DC bias for the base of transistor 90 is provided by a voltage divider comprising resistor 91 and variable resistor 93. The variable resistor 93 permits one to vary the bias and establish the setting of the squelch level.

As it is shown in the drawing in a dotted line 97, the collector can also be connected to the junction of resistor 26 and capacitor 28 instead of to the base of transistor 33. In this case, there will be no DC bias on the collector and the transistor 90 will work very close to the zero voltage and current point of its collector characteristic curve.

Considering now the operation of the squelch control, it is assumed that a stereo FM signal is received from a station and that switch 95 is opened whereas switch 66 is closed. As long as an RF signal is detected, the diode 62 is rendered non-conductive. Thus, the transistor 39 is responsive to the positive part of the 19 kc. signal providing a 38 kc. signal in the doubler stage. The ratio detector 14 produces a voltage across capacitor 24 the negative polarity of which is applied through resistor 94 to the base of transistor 90. This negative voltage overcomes the low positive bias produced by the voltage divider consisting of variable resistor 93 and resistor 91 and, thus, reverse biases the base-emitter junction. Under these conditions, both the base-emitter and the base-collector junctions become very large impedances so that the audio and 19 kc. signals may be amplified by transistor 33. This very large impedance provides a high degree of isolation of the audio and 19 kc. signal from the ratio detector capacitor 24.

When no FM is received such as, for example, when the receiver is tuned between stations, or when there is little or no RF signal applied to the ratio detector, the voltage across capacitor 24 disappears or is so low that the positive bias voltage applied by the voltage divider out of resistors 91 and 93 renders the transistor 90 conductive providing a short circuit of very low impedance to ground. If now, unwanted noise signals come through the transformer 12, these signals are bypassed to ground preventing the reproduction of any noise signal.

When collector of transistor 90 is connected through lead 97 (shown as dotted line in the drawing) to the junction of resistor 26 and capacitor 28, the operation of the short circuit squelch control is generally the same. However, a transistor is now operating with no DC bias voltage on the collector so that it operates very close to the zero point of its characteristic curves. If the positive bias voltage at the base of transistor 90 is not overcome due to the absence of an FM signal, the base-emitter junction as well as the base-collector junction is forward biased, providing two forward biased diodes in series and, therefore, a very small impedance so that unwanted noise signals are bypassed to ground. If an FM signal is received and detected, a negative voltage is now applied to the base reducing the positive voltage to a point that both base-emitter and base-collector junctions are now reversed biased providing very large impedances so that the audio and 19 kc. signals derived from the ratio detector 14 are available at the base of transistor 33.

When the receiver is tuned to a station broadcasting a monaural FM signal, the switch 66 is turned in mono position connecting the base of transistor 39 to ground. In this case a negative voltage is available at capacitor 24 and the short circuit squelch control is not operating so that the detected signal is translated through the base-emitter junction, the trap circuit 48, and capacitor 50 to the secondary windings 43 of transformer 40 to be demodulated by circuit 69. Since the transistor 39 is biased to be non-conducting an unwanted 19 kc. noise signal superimposed to the audio signal is squelched preventing any distortion.

Accordingly, the invention provides a short circuit squelch control which is automatically responsive to the presence or absence of an FM broadcast signal. The short circuit squelch control can, however, be used for any application where a controlled short is needed to bypass signals.

What is claimed is:

1. A squelch control circuit for noise suppression in frequency modulation receivers comprising in combination, a frequency discriminating circuit having first and second output means, said first output means providing audio frequency signals during the period of reception of frequency modulated signals, said second output means providing a direct current potential during the period of reception of the frequency modulated signals, audio frequency utilization means responsive to said audio frequency signals having input circuit means coupled to said first output means, transistor means having emitter, base and collector electrodes, said emitter electrode connected to a reference potential and said collector electrode coupled to said input circuit means, bias means connected to said base electrode for providing a bias voltage opposite to said direct current potential, and means connecting said second output means to said base electrode, said transistor means being rendered conductive in response to said bias voltage providing a short circuit during the period of no frequency modulation signal reception and being rendered non-conductive in response to said direct current potential from said second output means during the period of reception of said frequency modulation signals whereby said audio frequency signals are translated to said audio utilization means.

2. A squelch control according to claim 1 wherein said transistor means comprises a NPN type transistor, the collector of which is not biased so that said transistor works very close to the zero voltage and current point of its collector characteristic curve when a positive voltage is applied to said base electrode.

3. A squelch control according to claim 1 wherein said bias means is a voltage divider, which includes a variable resistor for setting the squelch level.

4. A squelch control according to claim 1 further including a filter capacitor connected between said base electrode and said reference potential.

References Cited

UNITED STATES PATENTS

| | | | |
|---|---|---|---|
| 2,652,488 | 9/1953 | Smeltzer et al. | 325—478 |
| 2,719,221 | 9/1955 | Dammers | 325—456 X |
| 3,366,884 | 1/1968 | Kurusu | 325—478 |

KATHLEEN H. CLAFFY, Primary Examiner

CHARLES JIRAUCH, Assistant Examiner

U.S. Cl. X.R.

325—456, 479